United States Patent [19]
Wong et al.

[11] Patent Number: 5,600,267
[45] Date of Patent: Feb. 4, 1997

[54] APPARATUS FOR A PROGRAMMABLE CML TO CMOS TRANSLATOR FOR POWER/SPEED ADJUSTMENT

[75] Inventors: Sing Y. Wong, Saratoga; Donald Yu, Fremont; Roger Bettman, Los Altos, all of Calif.

[73] Assignee: Cypress Semiconductor Corporation, San Jose, Calif.

[21] Appl. No.: 563,350

[22] Filed: Nov. 28, 1995

Related U.S. Application Data

[63] Continuation of Ser. No. 265,456, Jun. 24, 1994, abandoned.

[51] Int. Cl.$^6$ .............................................. H03K 19/0948
[52] U.S. Cl. ................... 326/73; 326/71; 326/74; 326/50
[58] Field of Search ..................... 307/451, 475, 307/443, 469, 202.1; 326/73, 74, 49, 50, 83, 71; 327/525

[56] References Cited

U.S. PATENT DOCUMENTS

| | | | |
|---|---|---|---|
| 4,638,189 | 1/1987 | Geannopoulos et al. | 307/465 |
| 4,727,266 | 2/1988 | Fujii et al. | 307/443 |
| 4,758,746 | 7/1988 | Birkner et al. | 307/465 |
| 4,806,793 | 2/1989 | Golab | 307/443 |
| 4,959,564 | 9/1990 | Steele | 307/465 |
| 4,983,862 | 1/1991 | Suzuki et al. | 326/71 |
| 5,134,311 | 7/1992 | Biber et al. | 307/270 |
| 5,162,672 | 11/1992 | McMahan et al. | 307/443 |
| 5,220,216 | 6/1993 | Woo | 326/50 |
| 5,223,751 | 6/1993 | Simmons et al. | |
| 5,341,045 | 8/1994 | Almulla | 307/475 |
| 5,355,029 | 10/1994 | Houghton et al. | 307/443 |
| 5,355,031 | 10/1994 | Fulkerson | 326/122 |

OTHER PUBLICATIONS

Neil Weste and Kamran Eshraghian, *Principles of CMOS VLSI Design, A Systems Perspective*, Jun. 1988, pp. 225–227.

*Primary Examiner*—Edward P. Westin
*Assistant Examiner*—Benjamin D. Driscoll
*Attorney, Agent, or Firm*—Blakely, Sokoloff, Taylor & Zafman LLP

[57] ABSTRACT

A CMOS circuit is disclosed for translating a signal from CML to CMOS logic voltage levels. The CMOS circuit includes two amplifier circuits coupled in parallel. The first amplifier circuit comprises of a programmable circuit and a CMOS inverter such that the CMOS inverter can be programmed "on" or "off" by the programmable circuit. The programmable circuit includes a programmable element which may be implemented using a fuse or floating gate technology. The second amplifying circuit comprises of a CMOS inverter. When the CMOS inverter in the first amplifier circuit is powered "on", the CMOS circuit is operating in a full power mode at high speed with both CMOS inverters operating. When the CMOS inverter in the first amplifier circuit is powered "off", the CMOS circuit is operating in a low power mode at a slower speed with only one CMOS inverter operating. During the full power and low power modes of operation, the translator circuit converts the CML circuit output signal, which has a full rail-to-rail output swing of about 1 volt, to CMOS compatible voltage levels, which is required to drive a TTL level output circuit.

26 Claims, 6 Drawing Sheets

APPARATUS FOR A PROGRAMMABLE CML TO CMOS TRANSLATOR FOR POWER/SPEED ADJUSTMENT

This is a continuation of application Ser. No. 08/265,456, filed Jun. 24, 1994, now abandoned.

The present invention relates to Bipolar Complementary Metal Oxide Semiconductor ("BiCMOS") processes and circuits created by such processes and more specifically for translating an output signal from a Current Mode Logic ("CML") circuit to a signal that is compatible with CMOS voltage levels.

In high performance digital logic designs, speed and power are two of the most commonly used criteria for technology selection. Although the power dissipation in CMOS circuits implemented with CMOS Field Effect Transistors ("FETs") is very low, this is only true for CMOS circuits that are not switching at high speed rates. Many CMOS circuits operate with power supply voltages between 2 V and 15 V, but must be 5 V to be TTL compatible. Since the logic level outputs are related to the power supply voltage chosen, the typical low logic level voltage for CMOS circuits are about 30% of Vcc and the high logic level voltage is Vcc minus about 30% of Vcc according to p. 514 of "Digital Electronics Concepts and Applications for Digital Design" by Richard J. Prestopnik (Saunders College Publishing, 1990). In the case of a TTL circuit, the low logic level voltage is 0 to 0.4 volts and the high logic level voltage is 2.4 to 5 volts. When CMOS circuits are fixed at a logic level, they do not conduct current and therefore negligible power is consumed. But when a CMOS circuit is switching from one logic state to another, current flows briefly and power is consumed. Therefore, the lower speed logic in a design may be designed with CMOS transistors in order to reduce the power consumption.

On the other hand, the faster speed logic in a design may be designed with CML in order to improve circuit performance. CML uses nonsaturating current-mode bipolar logic and can be implemented by limiting the current and voltage swings to ensure only active-mode bipolar junction transistor ("BJT") operation. Rather than being constructed around transistors that operate as simple "on" or "off" devices, the CML transistors are designed to operate at two different "on" and closely spaced voltage levels. Therefore, high performance digital logic designs are typically CML, including Emitter-Coupled Logic (ECL) which is a type of CML.

In order to interface a CML circuit with a CMOS or a TTL circuit, the output signal from the CML circuit must be transformed to a signal which is compatible with CMOS or TTL voltage levels. This translation requires a logic level translator that consumes a significant amount of DC power.

Figure 1:
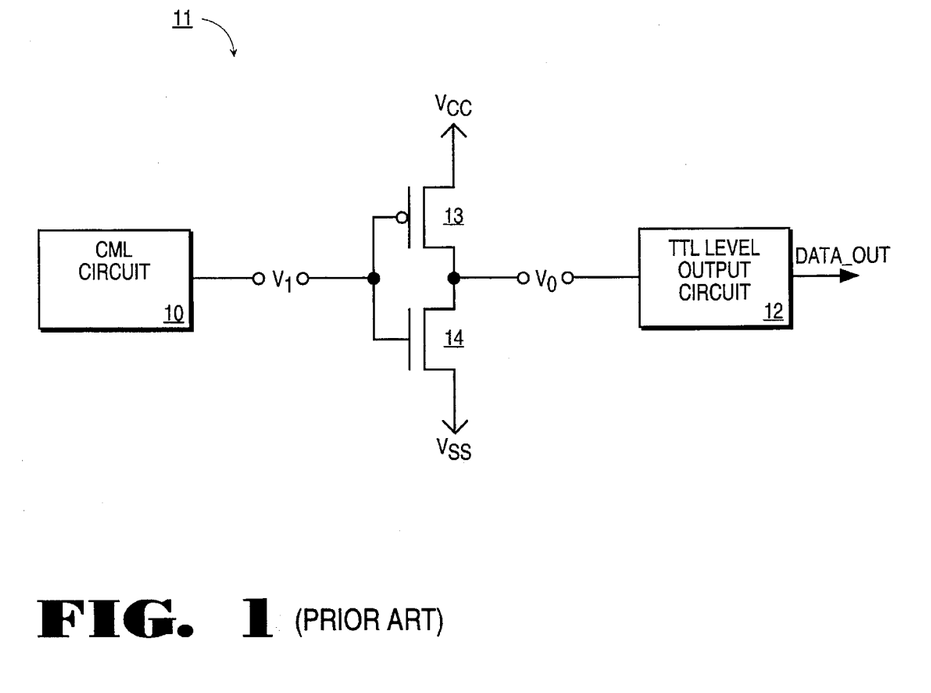
FIG. 1 illustrates a typical CML to CMOS translator.

The conventional CML to CMOS translator, a CMOS inverter 11, as shown in FIG. 1 consumes a significant amount of DC power since it does not have a power down option. CMOS inverter 11 includes a p-channel MOS transistor 13 and n-channel MOS transistor 14 coupled together at the drains of p-channel MOS transistor 13 and n-channel MOS transistor 14. Both the gates of p-channel MOS transistor 13 and n-channel MOS transistor 14 receive an input signal Vi from CML circuit 10 which is compatible with CML voltage levels. CMOS inverter 11 provides an output signal Vo which is compatible with CMOS voltage levels, to TTL level output circuit 12. Furthermore, TTL level output circuit 12 converts output signal Vo such that the Data-out signal can drive a TTL circuit. Reducing power requires reduced speeds and thus there are drawbacks to reducing power.

Therefore, it is desirable to provide a power down option for the translator circuit when high speed is not required such that the translator can be programmed to operate at a slower speed thereby reducing the overall power consumption of the design and yet allow, when required, high speed operation. Therefore, the present invention provides a translator circuit with a power down option by dividing the translator circuit into two sections, a first section and a second section which are coupled in parallel. The first section includes a translator similar to that of the prior art and the second section includes a programmable translator which may be programmed "on" or "off". Both of the translator circuits in the prior art and the present invention have MOS transistors with a width to length (W/L) ratio that allows the translators to respond to the 1 volt input signal Vi. However, in the present invention, the transistors are a percentage smaller than the transistors in the prior art and that percentage is determined by the desired power savings. Therefore, if the desired power savings is 70%, then the MOS transistors in the programmable translator in the first section of the present invention are 70% of the size of the prior art MOS transistors, and the MOS transistors in the second section of the present invention are 30% of the size of the prior art MOS transistors, such that when the first section is programmed "off" the present invention is powered down to operate at 30% of the full power.

BRIEF DESCRIPTION OF THE DRAWINGS

The objects, features and advantages of the present invention will become apparent to one skilled in the art from reading the following detailed description in which.

SUMMARY OF THE INVENTION

In one embodiment of the present invention, a circuit (referred to as a CMOS circuit because of its method of production) is disclosed for translating an output signal from a CML circuit to a signal that is compatible with CMOS voltage levels. The CMOS circuit includes two amplifier circuits coupled in parallel. Each amplifier circuit comprises of a CMOS inverter having a p-channel MOS transistor and an n-channel MOS transistor with their current/drain paths coupled in series. However, one amplifier circuit has a programmable circuit to program the CMOS inverter in that amplifier circuit "on" or "off" thereby making a programmable CMOS inverter. The advantage of having a programmable option on one of the amplifier circuits is to provide a power down mode such that the CMOS circuit can operate in low power by trading off speed, in other words, the translator is programmable to provide at least two modes—full power at highest speed and reduced power at a lower speed.

The programmable circuit includes a programmable element which may be implemented by using a fuse (e.g. one-time fusible link or anti-fuse) or a floating gate device such as those used in various reprogrammable logic devices (e.g. EEPALs, PROMS, EPROMS, EEPROMs, CPLDs, FPGAs). The programmable circuit also includes a p-channel MOS transistor and an n-channel MOS transistor both coupled to the programmable CMOS inverter at opposite ends of the current/drain path of the programmable CMOS inverter. Furthermore, the programmable element is coupled to the p-channel MOS transistor in the programmable circuit through an inverter and is coupled to the n-channel MOS transistor in the programmable circuit directly.

When the programmable element is at a logic "1", the p-channel MOS transistor in the programmable circuit receives a low signal and the n-channel transistor receives a high signal thereby turning on the p-channel and n-channel transistor in the programmable circuit. Furthermore, when the programmable element is at a logic "0", both the p-channel MOS transistor and the n-channel MOS transistor in the programmable circuit are turned "off". By controlling the operation of the p-channel and n-channel MOS transistors in the programmable circuit, one of the amplifier circuits can be powered "on" or "off".

The advantage of having two amplifier circuits connected in parallel, compared to the prior art which uses only one amplifier circuit, is that the size of the transistors in the amplifier circuits can be adjusted to provide the desired power saving. For example, if the prior art design includes transistors having a size based on a width to length (W/L) ratio of "1" that allows the CMOS circuit to translate an input signal having a 1 volt swing to a full rail-to-rail (e.g. Vcc to Vss) output swing, the present invention will also have a width to length ratio of "1" in order to ensure signal compatibility. But since the present invention includes at least two amplifying circuits, the MOS transistors in the programmable CMOS inverter will have MOS transistors that are x % the size of the MOS transistors in the prior art and the non-programmable CMOS inverter would then have MOS transistors that are (100-x) % the size of the MOS transistors in the prior art.

In one embodiment of the present invention, the MOS transistors in the programmable CMOS inverters are 70% the size of the prior art and the MOS transistors in the non-programmable CMOS inverters are 30% the size of the prior art MOS transistors. Furthermore, the size of the transistor is directly proportional to the power consumption and the speed of the transistor. Thus, when the programmable CMOS inverter is programmed "on", the CMOS circuit is operating in full power (100%) at high speed, and when the programmable CMOS inverter is programmed "off", the CMOS circuit is operating in low power (30%) at a slower speed.

This programmable technique can also be implemented by increasing the number of programmable CMOS inverters coupled in parallel. For example, if there are a total of nine programmable CMOS inverters and one non-programmable inverter, with each CMOS inverter reduced to 10% of the MOS transistors in the prior art, then 10 programmable options are available (e.g. power levels of 10%, 20%, 30%, 40%, 50%, 60%, 70%, 80%, 90% and 100% with corresponding speeds).

DETAILED DESCRIPTION OF THE INVENTION

In the following description, numerous specific details are set forth in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention.

Figure 2:
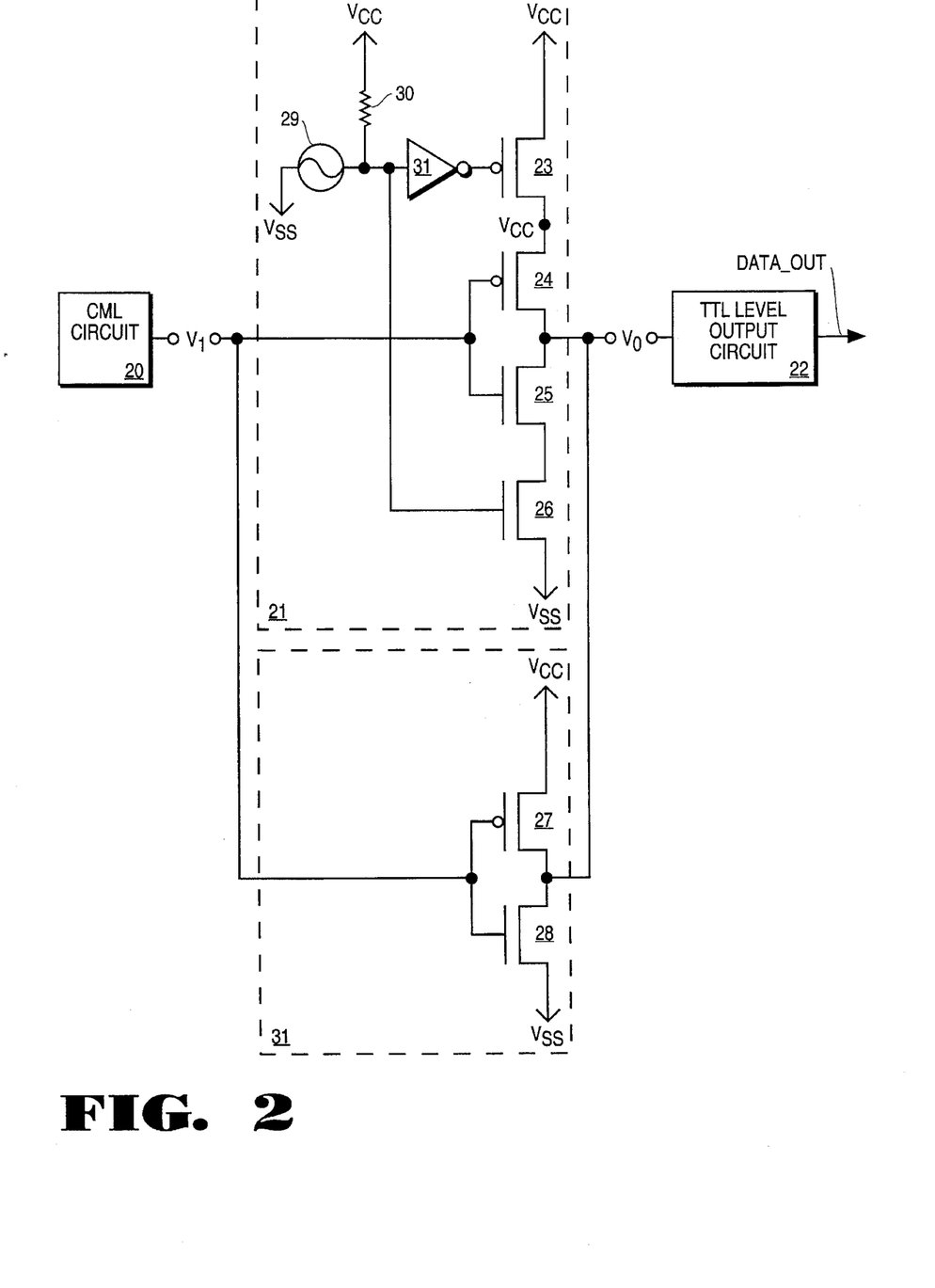
FIG. 2 illustrates a CML to CMOS translator in the present invention.

FIG. 2 illustrates a CMOS circuit in the present invention for translating a CML circuit 20 output signal Vi to a signal Vo that is compatible with CMOS voltage levels in order to drive TTL level output circuit 22. The TTL level output circuit 22 then translates signal Vo to a TTL level output signal Data-out which can be used to drive a TTL level circuit. Note that CML circuit 20 and TTL level output circuit 22 are well known in the art and may be implemented in a number of ways. An example of CML circuit 20 is shown in FIG. 3 and an example of TTL level output circuit 22 is shown in FIG. 4.

Figure 3:
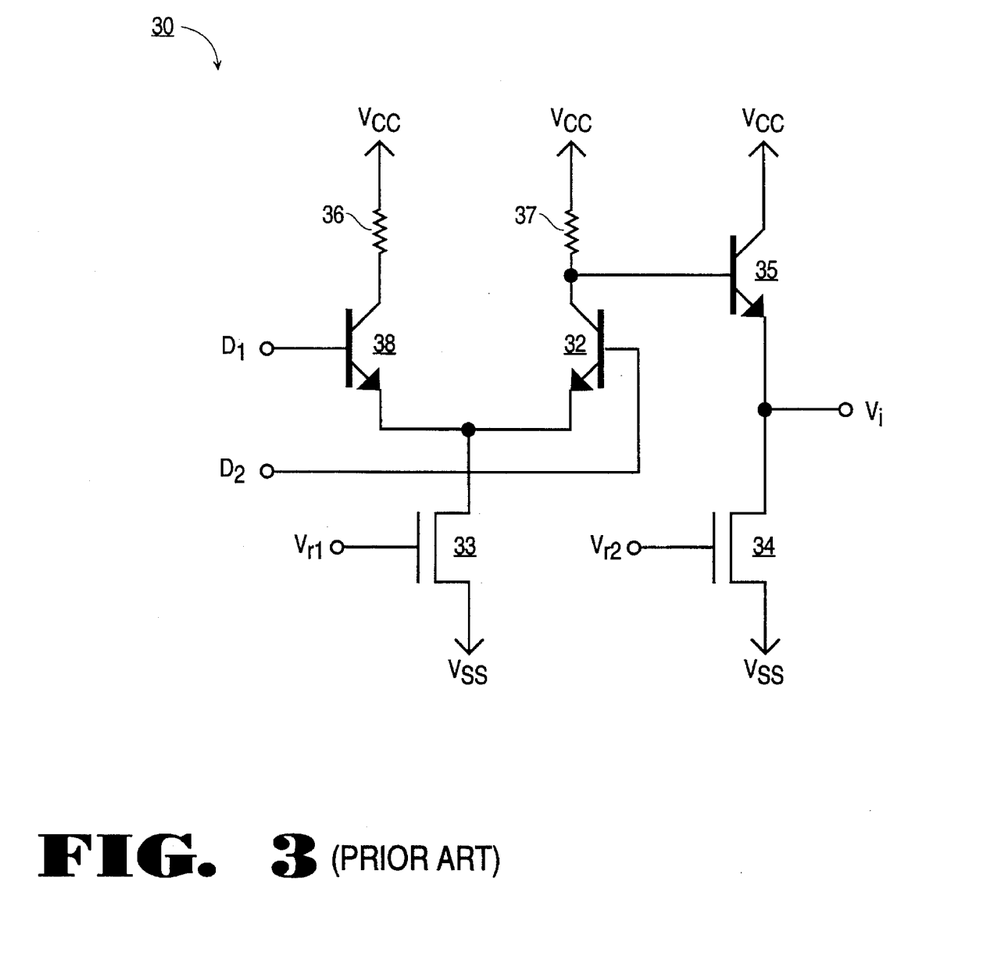
FIG. 3 illustrates a typical CML output circuit.

One embodiment of the CML circuit 20 referred to in FIG. 2 is shown in further detail in FIG. 3. CML circuit 30 is a typical CML gate which includes a differential input amplifier and an emitter-follower output. The differential input amplifier comprises of bipolar transistors 38 and 32 coupled together at their emitters which are connected to the drain of MOS transistor 33. The base of bipolar transistor 38 is coupled to data-input D1 and the base of bipolar transistor 32 is coupled to data-input D2. Data-input D2 is typically the complement (inverse) of data-input D1. Furthermore, the collector of bipolar transistor 38 is connected to resistor 36 which is connected to Vcc, and the collector of bipolar transistor 32 is connected to the base of bipolar transistor 35 and resistor 37 which is connected to Vcc. Bipolar transistor 35 has a collector coupled to Vcc and an emitter connected to the output of CML circuit 30 and to the drain of MOS transistor 34. MOS transistor 33 and 34 have their gates coupled to input signal Vr1 and Vr2 respectively, and their sources connected to Vss.

Figure 4:
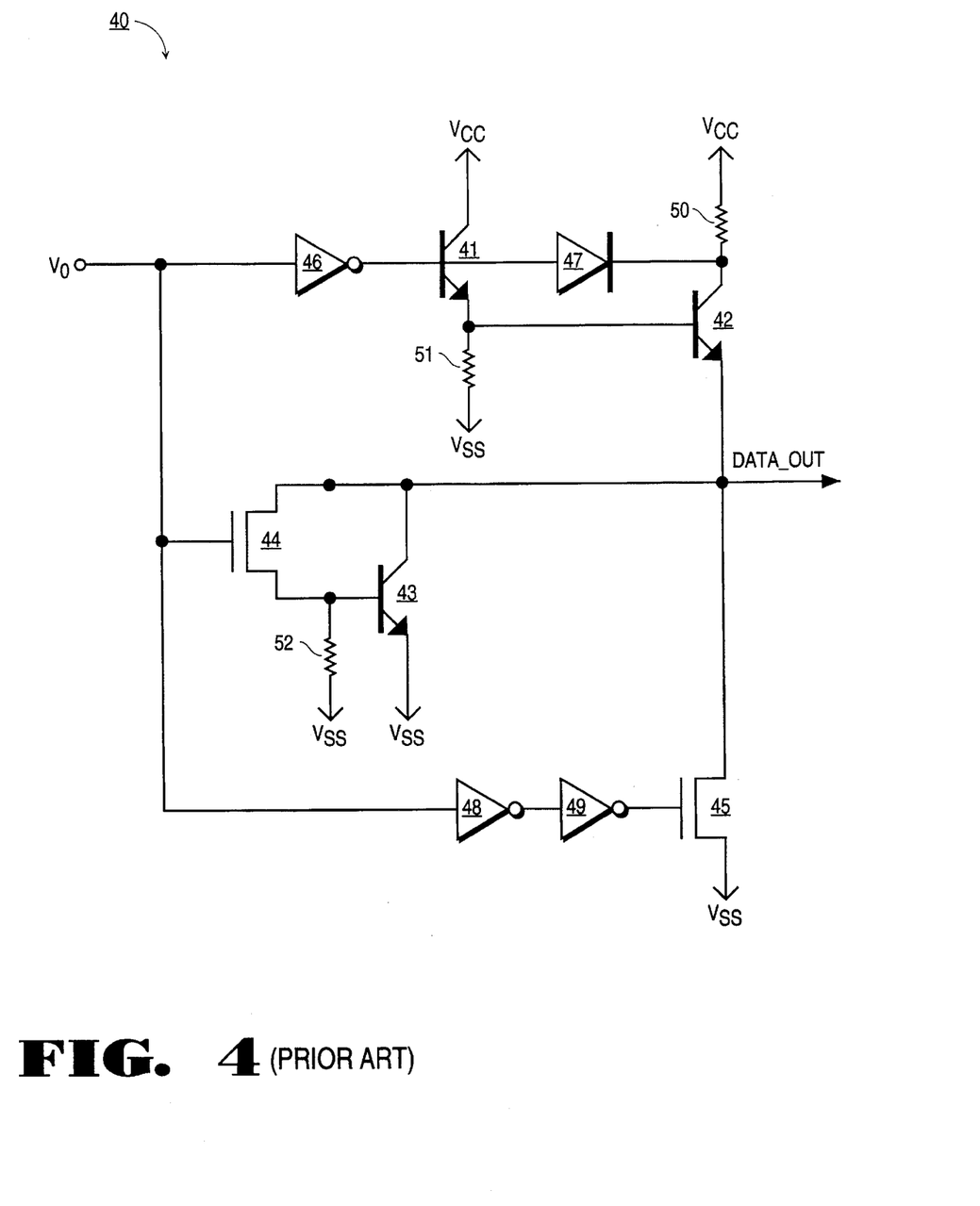
FIG. 4 illustrates a typical TTL output circuit.

One embodiment of BiCMOS TTL level output circuit 22, referred to in FIG. 2, is shown in further detail in FIG. 4. TTL level output circuit 40, shown in FIG. 2, receives an input signal Vo from the CMOS circuit 21 in the present invention. The input of TTL level output circuit 40, which responds to an input signal having CMOS voltage levels, is coupled to the input of inverter 46. Inverter 46 has an output coupled to the base of bipolar transistor 41 and to the input of diode 47. Bipolar transistor 41 also has a collector coupled to Vcc and an emitter coupled to Vss through resistor 51. Furthermore, the output of diode 47 is coupled to Vcc through resistor 50 and to the collector of bipolar transistor 42. Bipolar transistor 42 has a base coupled to the emitter of bipolar transistor 41, and an emitter coupled to the drain of MOS transistor 45 and to the output of TTL level output circuit 40.

The input of TTL level output circuit 40 is also coupled to the gate of MOS transistor 44 which has a drain coupled to the output of TTL level output circuit 40 and a source coupled to Vss through resistor 52 and to the base of bipolar transistor 43. The collector of transistor 43 is also coupled to the output of TTL level output circuit 40, and transistor 43 has an emitter coupled to Vss.

Furthermore, the input of TTL level output circuit 40 is also coupled to the gate of MOS transistor 45 through inverters 48 and 49 such that the drain of MOS transistor 45 is coupled to the output of TTL level output circuit 40 and the source of MOS transistor 45 is coupled to Vss.

Figure 6:
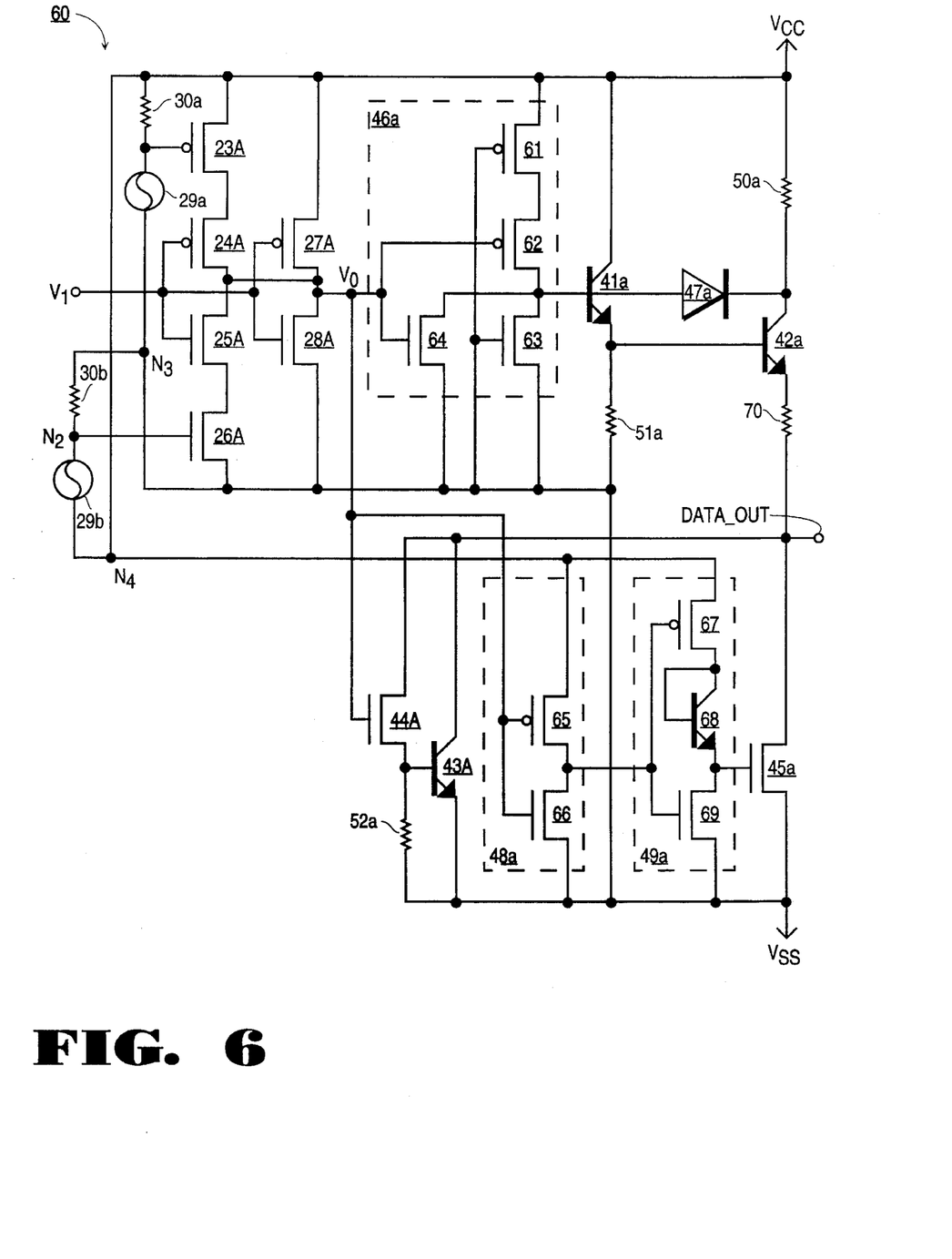
FIG. 6 illustrates an implementation of the present invention.

Note that an alternative embodiment 60 of TTL level output circuit shown in FIG. 6 uses specific circuits to implement inverters 46, 48 and 49 referred to in FIG. 4. Inverter 46 in FIG. 4 is implemented by the circuit in box 46a in FIG. 6 comprising of MOS transistors 61, 62, 63 and 64. Inverter 48 in FIG. 4 is implemented by the circuit in box 48*a* in FIG. 6 comprising of MOS transistors 65 and 66. Furthermore, inverter 49 in FIG. 4 is implemented by the circuit in box 49*a* in FIG. 6 comprising of MOS transistors 67 and 69 and bipolar transistor 68. Note that circuit elements 41*a*, 47*a*, 50*a*, 42*a*, 51*a*, 44*a*, 52*a*, 43*a* and 45*a* in FIG. 6 correspond respectively to circuit elements 41, 47, 50, 42, 51, 44, 52, 43 and 45 shown in FIG. 4. However, alternative embodiment 60 also includes resistor 70 which is coupled to the output of alternative embodiment 60.

Referring back to FIG. 2, CML circuit 20 provides an output voltage Vi having voltage levels from Vcc-Vbe to Vcc-2Vbe which is approximately a 1 volt voltage swing. The output of CML circuit 20 is coupled to the input of a CMOS circuit of the present invention. The CMOS circuit includes two amplifier circuits 21 and 31 coupled in parallel. Amplifier circuit 21 includes MOS transistors 23, 24, 25 and 26 having their source/drain paths coupled in series with one end coupled to Vcc and another end coupled to Vss. MOS transistors 23 and 24 are p-channel transistors and MOS transistors 25 and 26 are n-channel transistors such that the source of MOS transistor 23 is coupled to Vcc and the drain of MOS transistor 23 is coupled to the source of MOS transistor 24 and the drain of MOS transistor 24 is coupled to the drain of MOS transistor 25 and the source of MOS transistor 25 is coupled to the drain of MOS transistor 26 and the source of MOS transistor 26 is coupled to Vss.

Furthermore, the gates of MOS transistors 23 and 26 are coupled to a programmable element 29. The gate of MOS transistor 23 is coupled to the programmable element through inverter 31, and the gate of MOS transistor 26 is coupled to the programmable element directly such that the gates of MOS transistor 23 and MOS transistor 26 receive complementary signals from the programmable element. For example if programmable element 29 is a fuse which is left intact thus creating a short circuit, inverter 31 provides the gate of MOS transistor 23 with a "high" signal and the grounded fuse provides the gate of MOS transistor 26 with a "low" signal. Furthermore, if programmable element 29 is blown thereby creating an open circuit, Vcc and resistor 30 provides the input of inverter 31 with a "high" voltage and the output of inverter 31 provides the gate of MOS transistor 23 with a "low" voltage and the gate of MOS transistor 26 is pulled up to Vcc through resistor 30.

The programmable element may be implemented by using a fuse (e.g. one-time fusible link or anti-fuse) or a floating gate device such as those used in various reprogrammable logic devices (e.g. EEPALs, PROMs, EPROMS, EEPROMs, CPLDs, FPGAs). For example, a floating gate device may be implemented with a differential four-transistor EPROM cell known as a floating gate avalanche metal oxide semiconductor (FAMOS) (p. 3-1 Cypress Semiconductor Databook Mar. 1, 1992). By programming programmable element 29 to be a short circuit, translator circuit 21 operates in a low-power, low speed mode. When programmable element 29 is open, translator circuit 31 operates in high-speed mode but with high power.

In an alternative embodiment, rather than using an inverter such as inverter 31 in FIG. 2, two separate programmable elements may be used to control the operation of MOS transistors 23 and 26 such that the CMOS inverter comprising of MOS transistors 24 and 25 can be programmed "on" or "off". FIG. 6 illustrates this alternative embodiment. Fuse 29*a* is coupled to the gate of MOS transistor 23*a* and to resistor 30*a* at node N1. Resistor 30*b* which is coupled to Vcc and fuse 29*b* are coupled together at node N2. Furthermore, fuse 29*b*, resistor 30*b* and the gate of MOS transistor 26*a* are coupled together at node N2. Resistor 30*b* and fuse 29*a* are also coupled together at node N3 which is coupled to Vss. With the exception of the programmable elements described above, the CMOS circuit in this alternative embodiment operates in a similar manner to the CMOS circuit described in FIG. 2. Note that MOS transistors 23 through 28 in FIG. 2 correspond respectively to MOS transistor's 23*a* through 28*a* in FIG. 6.

Referring back to FIG. 2, amplifier circuit 21 operates as a CMOS inverter which can be programmed "on" and "off". MOS transistors 24 and 25 coupled together at their drains, form a CMOS inverter which receives output signal Vi from CML circuit 20. The CMOS inverter operates in the following manner.

If Vi is a logic "0" such that NMOS transistor 25 is "on weak" and PMOS transistor 24 is "on strong", then the output voltage Vo of the CMOS inverter in amplifier circuit 21 is Vcc. If Vi is a logical "1" such that NMOS transistor 25 is "on strong" and PMOS transistor 24 is "on weak", then the output voltage Vo is at ground. Thus, the output logic levels Vo of inverter 21 are Vcc and Vss such that a logic swing from Vss to Vcc results. Typically the reference voltage Vcc is 5 volts and another reference voltage Vss is 0 volts or ground.

As mentioned above, amplifier circuit 21 also includes MOS transistors 23 and 26 which function to program the CMOS inverter in amplifier circuit 21. When MOS transistor 23 receives a "high" input signal and when MOS transistor 26 receives a "low" input signal, MOS transistors 23 and 26 are turned "off" and therefore powers down the CMOS inverter in amplifier circuit 21. On the other hand, when MOS transistor 23 receives a "low" input signal and when MOS transistor 26 receives a "high" input signal, MOS transistors 23 and 26 are turned "on" and therefore the CMOS inverter in amplifier circuit 21 is powered "on".

Coupled in parallel with amplifier circuit 21 is amplifier circuit 31 which functions as a CML to CMOS translator. Unlike amplifier circuit 21 which has a power down option, amplifier circuit 31 can not be programmed "off". Amplifier circuit 31 includes MOS transistors 27 and 28 which operate together as a CMOS inverter, similar to the CMOS inverter comprised of MOS transistors 24 and 25 but without the programmable option.

Since amplifier circuits 21 and 31 are connected in parallel, the CMOS circuit which translates a signal from a CML voltage level to a CMOS voltage level may operate either in a full power mode or in a power down (reduced power) mode. The full power mode (and high speed) occurs when both amplifier circuits 21 and 31 are operating and the power down (and low speed) mode occurs when amplifier circuit 21 is programmed "off". Typically, as is known, the size of the MOS transistors is selected to meet specified dc and transient performance requirements. The advantage of having two amplifier circuits connected in parallel, compared to the prior art which uses only one amplifier circuit, is that the size of the MOS transistors can be adjusted to provide the desired power saving while maintaining the same width to length (W/L) ratio in order to ensure signal compatibility. The width to length (W/L) ratio is measured as shown in FIG. 2, 8 of page 40 of "Principles of CMOS VLSI Design" by Nell H. E. Weste and Kamram Eshraghian (Addision-Wesley Publishing Co., 1985), where length (L) is the distance the majority charge carriers move from the source to the drain in the channel region. For example, if the prior art design includes transistors having a W/L ratio of "1" that allows the CMOS circuit to translate an input signal having a 1 volt swing to an output signal having a full rail-to-rail swing (e.g. Vcc to Vss), corresponding MOS transistors 23 through 28 in the present invention will also have W/L ratios of "1" However, the size of the MOS transistors 23 through 26 in each CMOS inverter 21 and 31 in the present invention will be smaller than the MOS transistors used in the prior art by a certain percentage. In an embodiment of the invention, the length of each MOS device 23, 24, 25, 26, 27 and 28 is 0.5 microns and the widths of these devices are sized respectively as 300, 78, 6, 50, 30 and 3 microns.

If MOS transistors 23, 24, 25 and 25 in the programmable CMOS inverter 21 are reduced (using known scaling techniques) to 70% of the size of the prior art MOS transistors 13 and 14 and the MOS transistors in the CMOS inverter 31 are reduced to 30% of the size of the prior art MOS transistors 13 and 14, then when both CMOS inverters 21 and 31 are operating, the CMOS circuit is operating at full power. However, if CMOS inverter 21 is powered down (by programming the programmable element to be a short circuit), then the CMOS circuit is operating with only CMOS inverter 31 at 30% of full power. It is important to note that whenever, the CMOS circuit is operating at a lower power consumption rate, the speed of the CMOS circuit is decreased.

Figure 5:
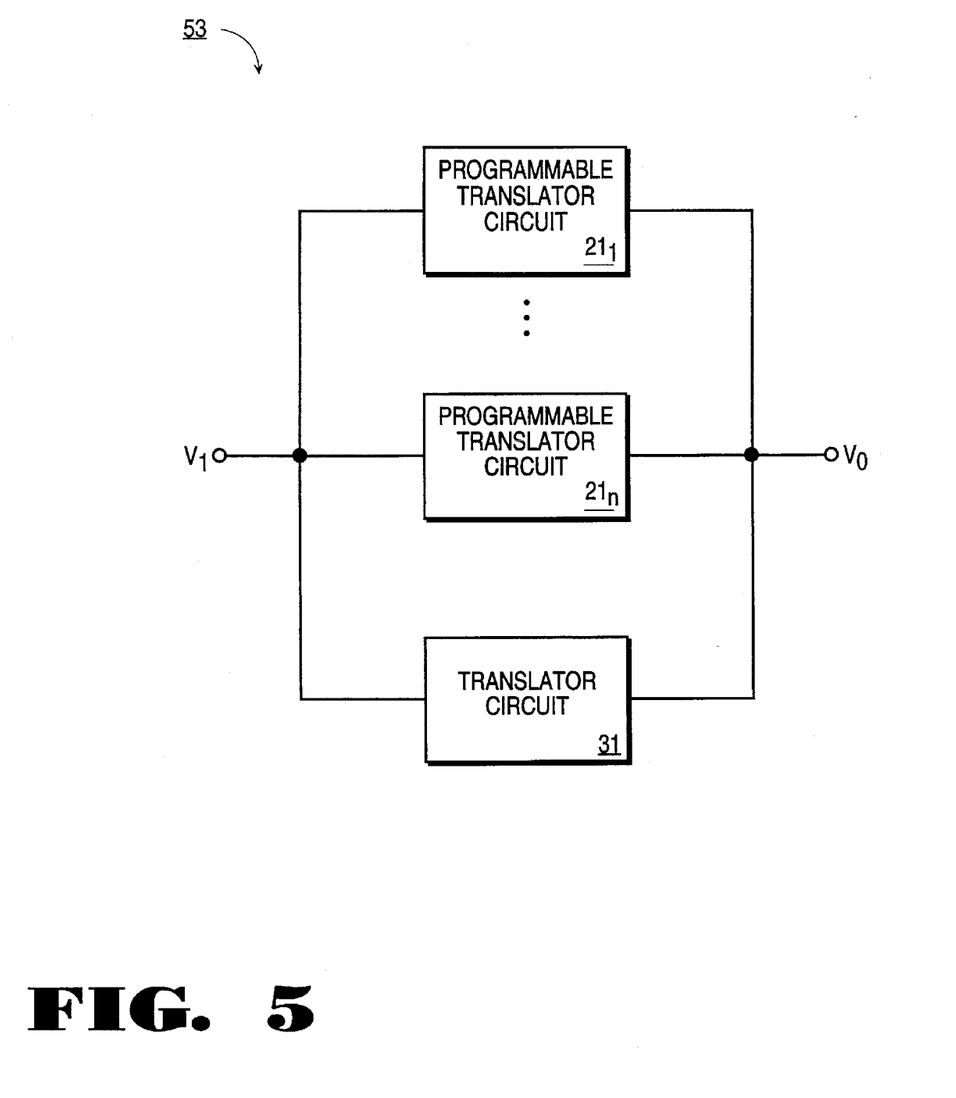
FIG. 5 illustrates a CML to CMOS translator with several programmable options.

Furthermore, since smaller MOS transistors can be designed using the same W/L ratio as the prior art, multiple CMOS inverters can be connected in parallel to provide various programmable options allowing the user's control of the trade off between higher speed and lower power. FIG. 5 illustrates n programmable amplifier circuits 21 coupled in parallel with amplifier circuit 31. For example, this programmable technique can be implemented with nine programmable CMOS inverters and one non-programmable CMOS inverter, each of the CMOS inverters having MOS transistors which are one tenth the size of the prior art MOS transistors. This specific implementation allows nine programmable options made from various combinations such that the low power mode may range from 10%–90% of the full power mode at increments of 10%.

An advantage of implementing the CMOS circuit with one or more programmable CMOS inverters is that various power down options are made available by trading off speed. Therefore, semiconductor integrated circuit manufacturers have the option to down-grade the devices that do not meet certain performance specifications by turning "off" the programmable amplifier circuit. This option allows the manufacturers to sell the downgraded integrated circuits as slower devices. Another advantage of this programmable technique is the ability to adjust the skew of the output signal Vo and the input threshold of the CMOS translator circuit.

What is claimed:

1. A translating circuit with a programmable power down option for translating a signal from a CML voltage level to a TTL voltage level, said translating circuit comprising:

a first amplifier circuit for amplifying said signal;

a second amplifier circuit for amplifying said signal, said second amplifier circuit being coupled in parallel to said first amplifier circuit such that an input of said first amplifier circuit and an input of said second amplifier circuit are coupled to an input of said translating circuit;

a programmable circuit liar controlling said first amplifier circuit and coupled to said first amplifier, said programmable circuit shutting down said first amplifier circuit in a power-down mode without shutting down said second amplifier circuit, wherein in said power-down mode, said second amplifier circuit responds to said signal independently of said first amplifier circuit; and a third amplifier circuit for translating said signal to a TTL voltage level, said third amplifier circuit having an input coupled to an output of said first amplifier circuit and an output of said second amplifier circuit, such that said third amplifier circuit being coupled in series with said first amplifier circuit and said second amplifier circuit, said third amplifier circuit having an output coupled to an output of said translating circuit.

2. A translating circuit according to claim 1 further comprising:

a fourth amplifier circuit for amplifier circuit for amplifying said signal, said fourth amplifier circuit being coupled in parallel to said first amplifier circuit such that an input of said fourth amplifier circuit is coupled to said input of said translating circuit, and an output of said fourth amplifier circuit is coupled to said input of said third amplifier circuit; and a second programmable circuit for controlling said fourth amplifier circuit, said programmable circuit for shutting down said fourth amplifier circuit in a second power-down mode without shutting down said first and second amplifier circuits, wherein said second power-down mode, said second amplifier circuit responds to said signal independently of said fourth amplifier circuit, and wherein said power-down mode, said first amplifier circuit is shut down, and in said second power-down mode, said fourth amplifier circuit is shut down.

3. A translating circuit according to claim 2, wherein said first amplifier circuit has devices that are smaller than devices in said fourth amplifier circuit, wherein a first mode, all of said first, second, third and fourth amplifier circuits respond to said signal, wherein in a second mode, said first and fourth amplifier circuits are shut down, and only said second and third amplifier circuits respond to said signal, wherein power consumption of said second mode is smaller than power consumption of said second power-down mode, wherein power consumption of said second power-down mode is smaller than power consumption of said power-down mode, and wherein power consumption of said power-down mode is smaller than power consumption of said first mode.

4. A translating circuit according to claim 1, wherein said programmable circuit comprising a programmable element.

5. A translating circuit according to claim 4, wherein said programmable element comprises a fuse.

6. A translating circuit according to claim 4, wherein said programmable element comprises a floating-gate device.

7. A translating circuit according to claim 4, wherein said first amplifier circuit is a first inverter circuit, and said second amplifier circuit is a second inverter circuit, and wherein said first inverter circuit comprises a first MOS transistor and a second MOS transistor wherein said first MOS transistor and said second MOS transistor each having a current/drain path connected in series to form a current/drain path of said first inverter circuit, said first inverter circuit further having an input coupled to a gate of said first MOS transistor and a gate of said second MOS transistor, said first inverter circuit further having an output coupled to said current/drain path of said first inverter at a point where said first MOS transistor and said second MOS transistor are connected.

8. A translating circuit according to claim 7, wherein said second inverter circuit comprising a fifth transistor and a sixth transistor wherein said fifth MOS transistor and said sixth MOS transistor each having a current/drain path connected in series to form a current/drain path of said second inverter circuit, said second inverter circuit further having a first input coupled to a gate of said fifth MOS transistor and a gate of said sixth MOS transistor and a second input coupled to a first reference voltage which is coupled to a first end of said current/drain path of said second inverter circuit and a third input coupled to a second reference voltage which is coupled to a second end of said current/drain path of said second inverter circuit, said second inverter circuit further having an output coupled to said current/drain path of said first inverter at a point where said fifth MOS transistor and said sixth MOS transistor are connected.

9. A translating circuit according to claim 7, wherein said programmable circuit further comprising a resistor and a third MOS transistor and a fourth MOS transistor such that a first input of said programmable circuit is coupled to a second reference voltage and to said programmable element, a second input of said programmable circuit is coupled to said second reference voltage and to said fourth MOS transistor, a third input of said programmable circuit is coupled to a first reference voltage and to said resistor, and a fourth input of said programmable circuit is coupled to said first reference voltage and to said third MOS transistor, wherein in said power-down mode, said third and fourth MOS transistors are off.

10. A translating circuit according to claim 9, wherein said programmable circuit further comprising an inverter wherein said programmable element having a first end coupled to said first input of said programmable circuit and a second end coupled to said third input of said programmable circuit through a resistor and to an input of said inverter and to a gate of said fourth MOS transistor, said inverter further having an output coupled to a gate of said third MOS transistor, said third MOS transistor having a current/drain path with a first end coupled in series to a first end of said current/drain path of said first inverter circuit and a second end coupled to said fourth input of said programmable circuit, said fourth MOS transistor having a current/drain path with a first end coupled in series to a second end of said current/drain path of said first inverter circuit and a second end coupled to said second input of said programmable circuit.

11. A translating circuit according to claim 9, wherein said programmable circuit comprising a second programmable element having a floating-gate device such that a fifth input of said programmable circuit is coupled to said first reference voltage which is coupled to said second programmable element, said programmable circuit further comprising a second resistor such that a sixth input of said programmable circuit is coupled to said second reference voltage which is coupled to said second resistor.

12. A translating circuit according to claim 11, wherein said programmable element of said programmable circuit having a first end coupled to said first input of said programmable circuit and a second end coupled to said third input of said programmable circuit through said resistor and to a gate of said third MOS transistor, said third MOS transistor further having a source coupled to said fourth input of said programmable circuit and a drain coupled to a first end of said current/drain path of said first inverter circuit, said second programmable element of said programmable circuit having a first end coupled to said fifth input of said programmable circuit and a second end coupled to said sixth input of said programmable circuit through said second resistor and to a gate of said fourth MOS transistor, said fourth MOS transistor further having a source coupled to said second input of said programmable circuit and a drain coupled to a second end of said current/drain path of said first inverter circuit.

13. A translating circuit with a programmable power down option for translating a signal from a CML voltage level to a TTL voltage level, said translating circuit comprising:

a first translator circuit for translating said signal;

a second translator circuit for translating said signal, said second translator circuit being coupled in parallel to said first translator circuit such than an input of said first translator circuit and an input of said second translator circuit are coupled to an input of said translating circuit;

a programmable circuit for controlling said first translator circuit and coupled to said first translator circuit, said programmable circuit shutting down said first translator circuit in a power-down mode without shutting down said second translator circuit, wherein in said power-down mode, said second translator circuit responds to said signal independently of said first translator circuit; and a third translator circuit, said third translator circuit for translating said signal to a TTL voltage level, said third translator circuit being coupled in series with said first translator circuit and said second translator circuit, such that an output of said first translator circuit and an output of said second translator circuit ate coupled to an input of said third translator circuit, said third translator circuit having an output coupled to an output of said translating circuit.

14. A translating circuit according to claim 13 further comprising:

a fourth translator circuit for amplifying said signal, said fourth translator circuit being coupled in parallel to said first translator circuit such that an input of said fourth translator circuit is coupled to said input of said translating circuit, and an output of said fourth translator circuit is coupled to said input of said third translator circuit; and a second programmable circuit for controlling said fourth translator circuit, said programmable circuit for shutting down said fourth translator circuit in a second power-down mode without shutting down said first and second translator circuits, wherein in said second power-down mode, said second translator circuit responds to said signal independently of said fourth translator circuit, and wherein in said power-down mode, said first translator circuit is shut down, and in said second power-down mode, said fourth translator circuit is shut down.

15. A translating circuit according to claim 14, wherein said first translator circuit has devices that are smaller than devices in said fourth translator circuit, wherein in a first mode, all of said first, second, third and fourth translator circuits respond to said signal, wherein in a second mode, said first and fourth translator circuits are shut down, and only said second and third translator circuits respond to said signal, wherein power consumption of said second mode is smaller than power consumption of said second power-down mode, wherein power consumption of said second power-down mode is smaller than power consumption of said power-down mode, and wherein power consumption of said power-down mode is smaller than power consumption of said first mode.

16. A translating circuit according to claim 13, wherein said programmable circuit comprising a programmable element.

17. A translating circuit according to claim 16, wherein said programmable element comprises a floating-gate device.

18. A translating circuit according to claim 16, wherein said programmable element comprises a fuse.

19. A translating circuit according to claim 16, wherein said first translator circuit is a first inverter circuit and said second translator circuit is a second inverter circuit and wherein said first inverter circuit comprises a first MOS transistor and a second MOS transistor wherein said first MOS transistor and said second MOS transistor each having a current/drain path connected in series to form a current/drain path of said first inverter circuit, said first inverter circuit further having an input coupled to a gate of said first MOS transistor and a gate of said second MOS transistor, said first inverter circuit further having an output coupled to said current/drain path of said first inverter at a point where said first MOS transistor and said second MOS transistor are connected.

20. A translating circuit according to claim 19, wherein said second inverter circuit comprising a fifth transistor and a sixth transistor wherein said fifth MOS transistor and said sixth MOS transistor each having a current/drain path connected in series to form a current/drain path of said second inverter circuit, said second inverter circuit further having a first input coupled to a gate of said fifth MOS transistor and a gate of said sixth MOS transistor and a second input coupled to a first reference voltage which is coupled to a first end of said current/drain path of said second inverter circuit and a third input coupled to a second reference voltage which is coupled to a second end of said current/drain path of said second inverter circuit, said second inverter circuit further having an output coupled to said current/drain path of said first inverter at a point where said fifth MOS transistor and said sixth MOS transistor are connected.

21. A translating circuit according to claim 16, wherein said programmable circuit further comprising a resistor and a third MOS transistor and a fourth MOS transistor such that a first input of said programmable circuit is coupled to a second reference voltage and to said programmable element, a second input of said programmable circuit is coupled to said second reference voltage and to said fourth MOS transistor, a third input of said programmable circuit is coupled to a first reference voltage and to said resistor and a fourth input of said programmable circuit is coupled to said first reference voltage and to said third MOS transistor, wherein in said power-down mode, said third and fourth MOS transistors are off.

22. A translating circuit according to claim 21, wherein said programmable circuit further comprising an inverter wherein said programmable element having a first end coupled to said first input of said programmable circuit and a second end coupled to said third input of said programmable circuit through a resistor and to an input of said inverter and to a gate of said fourth MOS transistor, said inverter further having an output coupled to a gate of said third MOS transistor, said third MOS transistor having a current/drain path with a first end coupled in series to a first end of said current/drain path of said first inverter circuit and a second end coupled to said fourth input of said programmable circuit, said fourth MOS transistor having a current/drain path with a first end coupled in series to a second end of said current/drain path of said first inverter circuit and a second end coupled to said second input of said programmable circuit.

23. A translating circuit according to claim 21, wherein said programmable circuit comprising a second programmable element such that a fifth input of said programmable circuit is coupled to said first reference voltage which is coupled to said second programmable element, said programmable circuit further comprising a second resistor such that a sixth input of said programmable circuit is coupled to said second reference voltage which is coupled to said second resistor.

24. A translating circuit according to claim 23, wherein said second programmable element comprises a floating-gate device.

25. A translating circuit according to claim 23, wherein said second programmable element comprises a fuse.

26. A translating circuit according to claim 23, wherein said programmable element of said programmable circuit having a first end coupled to said first input of said programmable circuit and a second end coupled to said third input of said programmable circuit through said resistor and to a gate of said third MOS transistor, said third MOS transistor further having a source coupled to said fourth input of said programmable circuit and a drain coupled to a first end of said current/drain path of said first inverter circuit, said programmable element of said second programmable element having a first end coupled to said fifth input of said programmable circuit and a second end coupled to said sixth input of said programmable circuit through said second resistor and to a gate of said fourth MOS transistor, said fourth MOS transistor further having a source coupled to said second input of said programmable circuit and a drain coupled to a second end of said current/drain path of said first inverter circuit.

* * * * *